(12) United States Patent
Forbes

(10) Patent No.: US 8,227,309 B2
(45) Date of Patent: Jul. 24, 2012

(54) LOCALIZED COMPRESSIVE STRAINED SEMICONDUCTOR

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/357,296

(22) Filed: Jan. 24, 2012

(65) Prior Publication Data

US 2012/0122287 A1    May 17, 2012

Related U.S. Application Data

(60) Continuation of application No. 12/463,619, filed on May 11, 2009, now Pat. No. 8,124,977, which is a division of application No. 11/356,335, filed on Feb. 16, 2006, now Pat. No. 7,544,584.

(51) Int. Cl.
*H01L 21/8238* (2006.01)

(52) U.S. Cl. ........ 438/199; 438/455; 438/431; 438/486; 257/E21.615; 257/E21.32

(58) Field of Classification Search .................. 438/199, 438/431, 455, 486; 257/E21.615, E21.32, 257/E21.561
See application file for complete search history.

(56) References Cited

U.S. PATENT DOCUMENTS

| | | |
|---|---|---|
| 3,953,839 A | 4/1976 | Dennison et al. |
| 4,241,359 A | 12/1980 | Izumi et al. |
| 4,322,980 A | 4/1982 | Suzuki et al. |
| 4,523,975 A | 6/1985 | Groves et al. |
| 4,962,051 A | 10/1990 | Liaw |
| 4,962,061 A | 10/1990 | Takata |
| 5,098,852 A | 3/1992 | Niki et al. |
| 5,234,535 A | 8/1993 | Beyer et al. |
| 5,240,876 A | 8/1993 | Gaul et al. |
| 5,261,999 A | 11/1993 | Pinker et al. |
| 5,298,452 A | 3/1994 | Meyerson |
| 5,343,064 A | 8/1994 | Spangler et al. |
| 5,344,524 A | 9/1994 | Sharma et al. |
| 5,441,591 A | 8/1995 | Imthurn et al. |
| 5,443,661 A | 8/1995 | Oguro et al. |
| 5,461,243 A | 10/1995 | Ek et al. |
| 5,476,813 A | 12/1995 | Naruse |

(Continued)

FOREIGN PATENT DOCUMENTS

JP    54-152464 A    11/1979

(Continued)

OTHER PUBLICATIONS

"Cornell Demonstrates a Universal Substrate", Compound Semiconductor, 3(2), (Mar./Apr. 1997), 27-29.

(Continued)

*Primary Examiner* — Julia Slutsker
(74) *Attorney, Agent, or Firm* — Schwegman, Lundberg & Woessner, P.A.

(57) ABSTRACT

One aspect of the present subject matter relates to a method for forming strained semiconductor film. According to an embodiment of the method, a crystalline semiconductor bridge is formed over a substrate. The bridge has a first portion bonded to the substrate, a second portion bonded to the substrate, and a middle portion between the first and second portions separated from the substrate. The middle portion of the bridge is bonded to the substrate to provide a compressed crystalline semiconductor layer on the substrate. Other aspects are provided herein.

20 Claims, 10 Drawing Sheets

U.S. PATENT DOCUMENTS

| | | |
|---|---|---|
| 5,482,869 A | 1/1996 | Kohyama |
| 5,489,792 A | 2/1996 | Hu et al. |
| 5,534,713 A | 7/1996 | Ismail et al. |
| 5,661,044 A | 8/1997 | Holland et al. |
| 5,673,223 A | 9/1997 | Park |
| 5,691,230 A | 11/1997 | Forbes |
| 5,759,898 A | 6/1998 | Ek et al. |
| 5,854,501 A | 12/1998 | Kao |
| 5,858,819 A | 1/1999 | Miyasaka |
| 5,877,070 A | 3/1999 | Goesele et al. |
| 5,879,996 A | 3/1999 | Forbes |
| 5,891,769 A | 4/1999 | Liaw et al. |
| 5,900,652 A | 5/1999 | Battaglia et al. |
| 5,906,951 A | 5/1999 | Chu et al. |
| 5,949,102 A | 9/1999 | Saida et al. |
| 5,961,877 A | 10/1999 | Robinson et al. |
| 5,963,817 A | 10/1999 | Chu et al. |
| 5,976,952 A | 11/1999 | Gardner et al. |
| 5,991,225 A | 11/1999 | Forbes et al. |
| 6,022,793 A | 2/2000 | Wijaranakula et al. |
| 6,049,106 A | 4/2000 | Forbes |
| 6,093,623 A | 7/2000 | Forbes |
| 6,096,433 A | 8/2000 | Kikuchi et al. |
| 6,103,598 A | 8/2000 | Yamagata et al. |
| 6,107,661 A | 8/2000 | Okabe et al. |
| 6,110,793 A | 8/2000 | Lee et al. |
| 6,136,666 A | 10/2000 | So |
| 6,143,628 A | 11/2000 | Sato et al. |
| 6,162,657 A | 12/2000 | Schiele et al. |
| 6,174,784 B1 | 1/2001 | Forbes |
| 6,174,820 B1 | 1/2001 | Habermehl et al. |
| 6,180,487 B1 | 1/2001 | Lin |
| 6,204,145 B1 | 3/2001 | Noble |
| 6,228,694 B1 | 5/2001 | Doyle et al. |
| 6,242,324 B1 | 6/2001 | Kub et al. |
| 6,245,615 B1 | 6/2001 | Noble et al. |
| 6,251,751 B1 | 6/2001 | Chu et al. |
| 6,261,876 B1 | 7/2001 | Crowder et al. |
| 6,274,457 B1 | 8/2001 | Sakai et al. |
| 6,274,460 B1 | 8/2001 | Delgado et al. |
| 6,309,950 B1 | 10/2001 | Forbes |
| 6,319,784 B1 | 11/2001 | Yu et al. |
| 6,328,796 B1 | 12/2001 | Kub et al. |
| 6,337,260 B1 | 1/2002 | Ishida |
| 6,368,938 B1 | 4/2002 | Usenko |
| 6,377,070 B1 | 4/2002 | Forbes |
| 6,413,827 B2 | 7/2002 | Farrar |
| 6,423,613 B1 | 7/2002 | Geusic |
| 6,424,001 B1 | 7/2002 | Forbes et al. |
| 6,437,375 B1 | 8/2002 | Beaman |
| 6,448,157 B1 | 9/2002 | Okonogi |
| 6,448,601 B1 | 9/2002 | Forbes et al. |
| 6,451,672 B1 | 9/2002 | Caruso et al. |
| 6,455,397 B1 | 9/2002 | Belford |
| 6,461,933 B2 | 10/2002 | Houston |
| 6,465,873 B1 | 10/2002 | Gonzalez |
| 6,476,434 B1 | 11/2002 | Noble et al. |
| 6,478,883 B1 | 11/2002 | Tamatsuka et al. |
| 6,486,008 B1 | 11/2002 | Lee |
| 6,496,034 B2 | 12/2002 | Forbes et al. |
| 6,497,763 B2 | 12/2002 | Kub et al. |
| 6,514,836 B2 | 2/2003 | Belford |
| 6,515,335 B1 | 2/2003 | Christiansen et al. |
| 6,531,727 B2 | 3/2003 | Forbes et al. |
| 6,538,330 B1 | 3/2003 | Forbes |
| 6,541,356 B2 | 4/2003 | Fogel et al. |
| 6,559,491 B2 | 5/2003 | Forbes et al. |
| 6,566,682 B2 | 5/2003 | Forbes |
| 6,582,512 B2 | 6/2003 | Geusic et al. |
| 6,583,052 B2 | 6/2003 | Shin |
| 6,583,437 B2 | 6/2003 | Mizuno et al. |
| 6,593,625 B2 | 7/2003 | Christiansen et al. |
| 6,597,203 B2 | 7/2003 | Forbes |
| 6,603,156 B2 | 8/2003 | Rim |
| 6,620,683 B1 | 9/2003 | Lin et al. |
| 6,630,713 B2 | 10/2003 | Geusic |
| 6,642,123 B2 | 11/2003 | Mun et al. |
| 6,649,476 B2 | 11/2003 | Forbes |
| 6,649,480 B2 | 11/2003 | Fitzgerald et al. |
| 6,649,492 B2 | 11/2003 | Chu et al. |
| 6,656,782 B2 | 12/2003 | Skotnicki et al. |
| 6,656,822 B2 | 12/2003 | Doyle et al. |
| 6,657,276 B1 | 12/2003 | Karlsson et al. |
| 6,689,671 B1 | 2/2004 | Yu et al. |
| 6,703,293 B2 | 3/2004 | Tweet et al. |
| 6,703,648 B1 | 3/2004 | Xiang et al. |
| 6,717,216 B1 | 4/2004 | Doris et al. |
| 6,734,940 B2 | 5/2004 | Hirabayashi |
| 6,740,913 B2 | 5/2004 | Doyle et al. |
| 6,746,937 B2 | 6/2004 | Beaman |
| 6,767,802 B1 | 7/2004 | Maa et al. |
| 6,812,116 B2 | 11/2004 | Huang et al. |
| 6,812,508 B2 | 11/2004 | Fukumi |
| 6,825,102 B1 | 11/2004 | Bedell et al. |
| 6,828,214 B2 | 12/2004 | Notsu et al. |
| 6,855,649 B2 | 2/2005 | Christiansen et al. |
| 6,881,650 B2 | 4/2005 | Lee et al. |
| 6,900,094 B2 | 5/2005 | Hammond et al. |
| 6,900,521 B2 | 5/2005 | Forbes et al. |
| 6,902,616 B1 | 6/2005 | Yamazaki et al. |
| 6,902,962 B2 | 6/2005 | Yeo et al. |
| 6,911,379 B2 | 6/2005 | Yeo et al. |
| 6,940,089 B2 | 9/2005 | Cheng et al. |
| 6,960,821 B2 | 11/2005 | Noble et al. |
| 6,963,078 B2 | 11/2005 | Chu |
| 6,987,037 B2 | 1/2006 | Forbes |
| 6,987,039 B2 | 1/2006 | Chatterjee |
| 6,994,762 B2 | 2/2006 | Clingman et al. |
| 7,008,854 B2 | 3/2006 | Forbes |
| 7,023,051 B2 | 4/2006 | Forbes |
| 7,041,575 B2 | 5/2006 | Forbes |
| 7,045,874 B2 | 5/2006 | Forbes |
| 7,081,395 B2 | 7/2006 | Chi et al. |
| 7,084,429 B2 | 8/2006 | Forbes |
| 7,115,480 B2 | 10/2006 | Forbes |
| 7,153,753 B2 | 12/2006 | Forbes |
| 7,198,974 B2 | 4/2007 | Forbes |
| 7,202,530 B2 | 4/2007 | Forbes |
| 7,220,656 B2 | 5/2007 | Forbes |
| 7,238,589 B2 | 7/2007 | Cohen et al. |
| 7,262,428 B2 | 8/2007 | Forbes |
| 7,271,445 B2 | 9/2007 | Forbes |
| 7,273,788 B2 | 9/2007 | Forbes |
| 7,326,597 B2 | 2/2008 | Forbes et al. |
| 7,335,545 B2 | 2/2008 | Currie |
| 7,394,111 B2 | 7/2008 | Forbes |
| 7,405,444 B2 | 7/2008 | Forbes |
| 7,429,763 B2 | 9/2008 | Forbes |
| 7,439,158 B2 | 10/2008 | Forbes et al. |
| 7,482,190 B2 | 1/2009 | Forbes |
| 7,485,544 B2 | 2/2009 | Forbes et al. |
| 7,494,906 B2 | 2/2009 | Kammler et al. |
| 7,544,584 B2 | 6/2009 | Forbes |
| 7,888,744 B2 | 2/2011 | Forbes et al. |
| 2001/0003269 A1 | 6/2001 | Wu et al. |
| 2002/0001965 A1 | 1/2002 | Forbes |
| 2002/0135020 A1 | 9/2002 | Skotnicki et al. |
| 2002/0163045 A1 | 11/2002 | Farrar |
| 2002/0185686 A1 | 12/2002 | Christiansen et al. |
| 2003/0013323 A1 | 1/2003 | Hammond et al. |
| 2003/0201468 A1 | 10/2003 | Christiansen et al. |
| 2003/0218189 A1 | 11/2003 | Christiansen et al. |
| 2003/0227072 A1 | 12/2003 | Forbes et al. |
| 2004/0048450 A1 | 3/2004 | Tweet et al. |
| 2004/0113174 A1 | 6/2004 | Chidambarrao et al. |
| 2004/0147079 A1 | 7/2004 | Forbes et al. |
| 2004/0171196 A1 | 9/2004 | Walitzki |
| 2004/0173798 A1* | 9/2004 | Forbes ............................ 257/69 |
| 2004/0212035 A1 | 10/2004 | Yeo et al. |
| 2004/0214366 A1 | 10/2004 | Segal et al. |
| 2004/0217352 A1 | 11/2004 | Forbes |
| 2004/0217391 A1 | 11/2004 | Forbes |
| 2004/0221792 A1 | 11/2004 | Forbes |
| 2004/0224480 A1 | 11/2004 | Forbes |
| 2004/0232422 A1 | 11/2004 | Forbes |
| 2004/0232487 A1 | 11/2004 | Forbes |
| 2004/0232488 A1 | 11/2004 | Forbes |

| | | |
|---|---|---|
| 2004/0235264 A1 | 11/2004 | Forbes |
| 2005/0017273 A1 | 1/2005 | Forbes et al. |
| 2005/0020094 A1 | 1/2005 | Forbes et al. |
| 2005/0023529 A1 | 2/2005 | Forbes |
| 2005/0023612 A1 | 2/2005 | Forbes |
| 2005/0023616 A1 | 2/2005 | Forbes |
| 2005/0029619 A1 | 2/2005 | Forbes |
| 2005/0029683 A1 | 2/2005 | Forbes et al. |
| 2005/0032296 A1 | 2/2005 | Forbes |
| 2005/0087842 A1 | 4/2005 | Forbes |
| 2005/0118754 A1 | 6/2005 | Henley et al. |
| 2005/0156210 A1 | 7/2005 | Currie et al. |
| 2005/0156230 A1 | 7/2005 | Forbes et al. |
| 2005/0169055 A1 | 8/2005 | Lung |
| 2005/0184345 A1 | 8/2005 | Lin et al. |
| 2005/0199945 A1 | 9/2005 | Kodama et al. |
| 2005/0212065 A1 | 9/2005 | Forbes |
| 2005/0224867 A1 | 10/2005 | Huang et al. |
| 2005/0231237 A1 | 10/2005 | Chang |
| 2005/0247934 A1 | 11/2005 | Kitakado et al. |
| 2005/0247972 A1 | 11/2005 | Forbes |
| 2005/0250274 A1 | 11/2005 | Forbes et al. |
| 2005/0259475 A1 | 11/2005 | Forbes |
| 2005/0276117 A1 | 12/2005 | Forbes |
| 2005/0285139 A1 | 12/2005 | Forbes |
| 2006/0001094 A1 | 1/2006 | Forbes |
| 2006/0003597 A1 | 1/2006 | Golonzka et al. |
| 2006/0011982 A1 | 1/2006 | Forbes |
| 2006/0022282 A1 | 2/2006 | Wirbeleit et al. |
| 2006/0024917 A1 | 2/2006 | Henley et al. |
| 2006/0027876 A1 | 2/2006 | Jung et al. |
| 2006/0094175 A1 | 5/2006 | Cohen et al. |
| 2006/0097281 A1 | 5/2006 | Forbes |
| 2006/0118915 A1 | 6/2006 | Hwang |
| 2006/0148181 A1 | 7/2006 | Chan et al. |
| 2006/0208343 A1 | 9/2006 | Forbes |
| 2006/0223255 A1 | 10/2006 | Chen et al. |
| 2006/0234455 A1 | 10/2006 | Chen et al. |
| 2006/0244074 A1 | 11/2006 | Chen et al. |
| 2006/0244105 A1 | 11/2006 | Forbes et al. |
| 2006/0246670 A1 | 11/2006 | Khemka et al. |
| 2006/0258063 A1 | 11/2006 | Forbes |
| 2006/0258123 A1 | 11/2006 | Forbes |
| 2006/0263994 A1 | 11/2006 | Forbes |
| 2006/0267152 A1 | 11/2006 | Forbes |
| 2006/0292822 A1 | 12/2006 | Xie |
| 2007/0015347 A1 | 1/2007 | Mehta et al. |
| 2007/0087482 A1 | 4/2007 | Yeh et al. |
| 2007/0087514 A1 | 4/2007 | Hamamoto |
| 2007/0096170 A1 | 5/2007 | Chidambarrao et al. |
| 2007/0096193 A1 | 5/2007 | Forbes |
| 2007/0108529 A1 | 5/2007 | Huang et al. |
| 2007/0164361 A1 | 7/2007 | Forbes |
| 2007/0187683 A1 | 8/2007 | Forbes |
| 2007/0215936 A1 | 9/2007 | Ko et al. |
| 2007/0238320 A1 | 10/2007 | Bhattacharyya et al. |
| 2008/0029832 A1 | 2/2008 | Forbes |
| 2008/0029840 A1 | 2/2008 | Forbes et al. |
| 2008/0042211 A1 | 2/2008 | Bhattacharyya et al. |
| 2009/0108363 A1 | 4/2009 | Forbes et al. |
| 2009/0218566 A1 | 9/2009 | Forbes |

FOREIGN PATENT DOCUMENTS

| | | |
|---|---|---|
| JP | 54-155770 A | 12/1979 |
| JP | 04-304653 | 10/1992 |
| JP | 04372152 | 12/1992 |
| JP | 2001-093887 | 4/2001 |

OTHER PUBLICATIONS

Abe, T, "Silicon Wafer-Bonding Process Technology for SOI Structures", Extended Abstracts of the 22nd (1990 International) Conference on Solid State Devices and Materials, (1990), 853-856.

Aberg, I, et al., "Electron and hole mobility enhancements in sub-10 nm-thick strained silicon directly on insulator fabricated by a bond and etch-back technique", 2004 Symposium on VLSI Technology Digest of Technical Papers, (Jun. 2004), 52-53.

Aberg, I., et al., "High electron and hole mobility enhancements in thin-body strained Si/strained SiGe/strained Si heterostructures on insulator", IEEE International Electron Devices Meeting, 2004. IEDM Technical Digest., (Dec. 2004), 173-176.

Ang, Kah Wee, "Enhanced performance in 50 nm N-MOSFETs with silicon-carbon source/drain regions", IEEE International Electron Devices Meeting, 2004. IEDM Technical Digest., (Dec. 2004), 1069-1071.

Auberton-Herve, A J, "SOI: Materials to Systems", International Electron Devices Meeting. Technical Digest, (1996), 3-10.

Auberton-Herve, A. J., "SOI: Materials to Systems", Digest of the International Electron Device Meeting, San Francisco, (Dec. 1996), 3-10.

Autumn, Kellar, et al., "Adhesive force of a single gecko foot-hair", Nature, 405(6787), (Jun. 2000), 681-685.

Autumn, Kellar, et al., "Evidence for van der Waals adhesion in gecko setae.", Proceedings of the National Academy of Science U S A.; 99(19), (Sep. 17, 2002), 12252-6.

Belford, Rona E, et al., "Performance-Augmented CMOS Using Back-End Uniaxial Strain", IEEE 60th DRC. Conference Digest Device Research Conference, 2002, (Jun. 24-26, 2002), 41-42.

Berti, M., "Composition and Structure of Si-Ge Layers Produced by Ion Implantation and Laser Melting", Journal of Materials Research, 6(10), (Oct. 1991), 2120-2126.

Berti, M., "Laser Induced Epitaxial Regrowth of Si[sub 1-x]Ge[sub x]/Si Layers Produced by Ge Ion Implantation", Applied Surface Science, 43, (1989), 158-164.

Bhattacharyya, Arup, et al., "Devices and Methods to Improve Carrier Mobility", U.S. Appl. No. 11/398,809, filed Apr. 6, 2006.

Biever, Celeste, "Secret of 'strained silicon' revealed: behind closed doors, Intel has perfected a novel way to improve chip performance.", New Scientist, 180(i2426-2428), (Dec. 20, 2003), 2 pgs.

Brown, Chappell, "Bonding twist hints at universal substrate", EETimes, (1997), 2 pages.

Bruel, M, "Smart-Cut: a new silicon on insulator material technology based on hydrogen implantation and wafer bonding", Japanese Journal of Applied Physics, Part 1 (Regular Papers, Short Notes & Review Papers), 36(3B), (1997), 1636-1641.

Cai, J., "Performance Comparison and Channel Length Scaling of Strained Si FETs on SiGe-On-Insulator (SGOI)", IEEE International Electron Devices Meeting, 2004. IEDM Technical Digest., (Dec. 2004), 165-168.

Cartagena, E, et al., "Bonded Etchback Silicon on Sapphire Bipolar Junction Transistors", Extended Abstracts—Electrochemical Society (1), Program and Abstracts: 183rd Meeting of the Electrochemical Society, Pennington, NJ, (1993), 191.

Chen, Xiangdong, et al., "Vertical P-MOSFETs with heterojunction between source/drain and channel", IEEE Device Research Conference, (2000), 25-26.

Cheng, Z., et al., "Fully depleted strained-SOI n- and p-MOSFETs on bonded SGOI substrates and study of the SiGe/BOX interface", IEEE Electron Device Letters, 25(3), (Mar. 2004), 147-49.

Chilton, B T, et al., "Solid phase epitaxial regrowth of strained Si(1-x)Ge(x)/Si strained layer structures amorphized by ion implantation", Applied Physics Letters, 54(1), (Jan. 2, 1989), 42-44.

Chleirigh, C. Ni, "Mobility and Sub-threshold Characteristics in High-Mobility Dual-Channel Strained Si/Strained SiGe P-MOSFETs", IEEE Device Research Conference, Santa Barbara, CA Jun. 20-22, 2005, 203-204.

Choe, K. S., et al., "Minority-Carrier Lifetime Optimization in Silicon MOS Devices by Intrinsic Gettering", Journal of Crystal Growth, 218(2-4), (Sep. 2000), 239-44.

Chu, T. L., et al., "Films of silicon nitride-silicon dioxide mixtures", J. Electrochem. Soc., 115, (1968), 318-321.

Clark, Don, et al., "Intel unveils tiny new transistors: Process handles circuits 1/2000th the width of a human hair", The Wall Street Journal, (Aug. 13, 2002), 3 pages.

Clifton, P A, et al., "A process for strained silicon n-channel HMOSFETs", ESSDERC'96. Proceedings of the 26th European Solid State Device Research Conference, (Sep. 1996), 519-22.

Dharmatilleke, S N, et al., "Anodic Bonding of Glass to Glass and Silicon to Glass or Silicon to Silicon Through a Very Thick Thermally Grown SiO2 Layer", Proceedings of IS 3M International Symposium on Smart Structures and Microsystems, http://dolphin.eng.uc.edu/projects/bonding/paper.pdf, (2000), 32.

Dubbelday, W B, et al., "Oscillatory strain relaxation in solid phase epitaxially regrown silicon on sapphire", Proceedings of the First International Workshop Lattice Mismatched Thin Films, (Sep. 13-15, 1998), 13-17.

Fischetti, M V, et al., "Band structure, deformation potentials, and carrier mobility in strained Si, Ge, and SiGe alloys", Journal of Applied Physics, 80(4), (Aug. 15, 1996), 2234-2252.

Forbes, K Y, "Non-Volatile Memory Device with Tensile Strained Silicon Layer", U.S. Appl. No. 11/260,339 (client ref No. 05-0753—Leffert file), 26 pgs, filed Oct. 27, 2005.

Forbes, L., "Localized Compressive Strained Semiconductor", U.S. Appl. No. 11/346,335, filed Feb. 16, 2006.

Forbes, L., "Localized Compressive Strained Semiconductor", U.S. Appl. No. 11/356,335, filed Feb. 16, 2006.

Forbes, L., "Micromechanical Strained Semiconductor by Wafer Bonding", U.S. Appl. No. 11/432,578, filed May 11, 2006.

Forbes, L., "Micromechanically Strained Microconductor Film", U.S. Appl. No. 10/379,749, filed Mar. 5, 2003.

Forbes, L., et al., "Strained Semiconductor by Full Wafer Bonding", U.S. Appl. No. 11/475,798, filed Jun. 27, 2006.

Forbes, Leonard, "Non-Volatile Memory Device With Tensile Strained Silicon Layer", U.S. Appl. No. 11/260,339, filed Oct. 27, 2005 (Client Ref. No. 05-0753), 26 pages.

Forbes, Leonard, "Strained Semiconductor, Devices and Systems and Methods of Formation,", U.S. Appl. No. 11/497,632, filed Aug. 2, 2006.

Fournel, F, et al., "Ultra High Precision of the Tilt/Twist Misorientation Angles in Silicon/Silicon Direct Wafer Bonding", Abstract—Electronic Materials Conference, (Jun. 2002), p. 9.

Garcia, G A, et al., "High-quality CMOS in thin (100 nm) silicon on sapphire", IEEE Electron Device Letters, 9(1), (Jan. 1988), 32-34.

Ghani, T., "A 90nm High Volume Manufacturing Logic Technology Featuring Novel 45nm Gate Length Strained Silicon CMOS Transistors", Technical Digest IEEE International Electron Devices Meeting, (Dec. 2003), 978-980.

Goto, K., "Technology Booster using Strain-Enhancing Laminated SiN (SELS) for 65nm Node Hp MPUs", IEDM Technical Digest. IEEE International Electron Devices Meeting, (Dec. 2004), 209-212.

Haddad, H., et al., "Carbon Doping Effects on Hot Electron Trapping", 28th Annual Proceedings. Reliability Physics 1990, (Mar. 1990), 288-9.

Harendt, Christine, "Silicon on Insulator Material by Wafer Bonding", Journal of Electronic Materials, 20(3), (Mar. 1991), 267-77.

Imthurn, George P, et al., "Bonded Silicon-on-Sapphire Wafers and Devices", Journal of Applied Physics, 72(6), (Sep. 1992), 2526-7.

Irie, H., et al., "In-plane mobility anisotropy and universality under uni-axial strains in nand p-MOS inversion layers on (100), [110], and (111) Si", IEEE International Electron Devices Meeting, 2004. IEDM Technical Digest., (Dec. 2004), 225-228.

Iyer, S S.K, "Separation by Plasma Implantation of Oxygen (SPIMOX) operational phase space", IEEE trans. on Plasma Science, 25, (1997), 1128-1135.

Jurczak, M, "SON (silicon on nothing)—a new device architecture for the ULSI era", VLSI Technology, 1999. Digest of Technical Papers. 1999 Symposium on, Jun. 14-16, 1999, 29-30.

Kal, S., et al., "Strained Silicon-SiGe Devices Using Germanium Implantation", IETE Journal of Research, 43 (2-3), (Mar. 1997), 185-192.

Kalavade, Pranav, et al., "A novel sub-10 nm transistor", 58th DRC. Device Research Conference. Conference Digest, (Jun. 19-21, 2000), 71-72.

Kawasaki, Hirohisa, "Impact of Parasitic Resistance and Silicon Layer Thickness Scaling for Strained-Silicon MOSFETs on Relaxed Si1-xGex virtual substrate", IEEE International Electron Devices Meeting, 2004. IEDM Technical Digest., (Dec. 2004), 169-172.

Komoda, T., "Mobility Improvement for 45nm Node by Combination of Optimized Stress Control and Channel Orientation Design", IEEE International Electron Devices Meeting, 2004. IEDM Technical Digest., (Dec. 2004), 217-220.

Kostrzewa, M, et al., "Testing the Feasibility of strain relaxed InAsP and InGaAs compliant substrates", EMC 2003 International Conference Indium Phosphide and Related Materials. Conference Proceedings, (Jun. 2003), p. 8.

Lasky, J. B., "Wafer Bonding for Silicon-on-Insulator Technologies", Applied Physics Letters, 48(1), (Jan. 6, 1986), 78-80.

Loo, Y L, et al., "Contact Printing With Nanometer Resolution", Device Research Conference, (Jun. 2002), 149-150.

Lu, D., "Bonding Silicon Wafers by Use of Electrostatic Fields Followed by Rapid Thermal Heating", Materials Letters, 4(11), (Oct. 1986), 461-464.

Lu, X., et al., "SiGe and SiGeC Surface Alloy Formation Using High-Dose Implantation and Solid Phase Epitaxy", Proceedings of the 11th International Conference on Ion Implantation Technology, Austin, TX, (1997), 686-689.

Maikap, S., "Package-strain-enhanced device and circuit performance", IEEE International Electron Devices Meeting, 2004. IEDM Technical Digest., (Dec. 2004), 233-236.

Meyerson, B S, "SiGe-Channel Heterojunction p-MOSFET's", IEEE Transactions on Electron Devices, 41(1), Authors: Verdonckt-Vandebroek, S.; Crabbe, E.F.; Meyerson, B.S.; Harame, D.L.; Restle, P.J.; Stork, J.M.C.; Johnson, J.B, (Jan. 1994), 90-101.

Mizuno, T, et al., "Advanced SOI-MOSFETs with Strained-Si Channel for High Speed CMOS Electron/Hole Mobility Enhancement", 2000 Symposium on VLSI Technology. Digest of Technical Papers, (2000), 210-211.

Mizushima, I., "Empty-space-in-silicon technique for fabricating a silicon-on-nothing structure", Applied Physics Letters, 77(20), American Institute of Physics, NY, (Nov. 13, 2000), 3290-3292.

Moran, Peter, "Strain Relaxation in Wafer-Bonded SiGe/Si Heterostructures Due to Viscous Flow of an Underlying Borosilicate Glass", Electronic Materials Conference, Santa Barbara, Jun. 2002, Abstract, (Jun. 2002), pp. 8-9.

Mumola, P. B., et al., "Recent advances in thinning of bonded SOI wafers by plasma assisted chemical etching", Proceedings of the Third International Symposium on Semiconductor Wafer Bonding: Physics and Applications, (1995), 28-32.

Nayak, D. K., "High performance GeSi quantum-well PMOS on SIMOX", International Electron Devices Meeting 1992. Technical Digest, (1992), 777-780.

Nichols, F. A., et al., "Surface- (interface-) and volume-diffusion contributions to morphological changes driven by capillarity", Transactions of the American Institute of Mining, Metallurgical and Petroleum Engineers, 233(10), (1965), 1840-8.

Numata, Toshinori, "Performance Enhancement of Partially- and Fully-Depleted Strained-SOI MOSFETs and Characterization of Strained-Si Device Parameters", IEEE International Electron Devices Meeting, 2004. IEDM Technical Digest., (Dec. 2004), 177-180.

Omi, Hiroo, et al., "Semiconductor Surface with Strain Control", http://www.brl.ntt.co.jp/J/kouhou/katsudou/report00/E/report04_e.html.

O'Neill, A G, et al., "High speed deep sub-micron MOSFET using high mobility strained silicon channel", ESSDERC '95. Proceedings of the 25th European Solid State Device Research Conference, (Sep. 1995), 109-12.

Ouyang, Q, et al., "Bandgap Engineering in Deep Submicron Vertical pMOSFETs", IEEE 58th DRC. Device Research Conference. Conference Digest, (2000), 27-28.

Paine, D. C, et al., "The Growth of Strained Si]-xGex Alloys on (100) Silicon Using Solid Phase Epitaxy", Journal of Materials Research, 5(5), (May 1990), 1023-1031.

People, R., "Calculation of critical layer thickness versus lattice mismatch for GexSi1-x/Si strained-layer heterostructures", Applied Physics Letters, 47(3), (1985), 322-324.

Pidin, S., "A Novel Strain Enhanced CMOS Architecture Using Selectively Deposited High Tensile and High Compressive Silicon Nitride Films", IEEE International Electron Devices Meeting, 2004. IEDM Technical Digest., (Dec. 2004), 213-216.

Rim, Kern, et al., "Fabrication and analysis of deep submicron strained-Si n-MOSFET's", IEEE Transactions on Electron Devices, 47(7), (Jul. 2000), 1406-1415.

Rim, Kern, et al., "Strained Si NMOSFETs for High Performance CMOS Technology", 2001 Symposium on VLSI Technology. Digest of Technical Papers, (2001), 59-60.

Rim, Kern, et al., "Transconductance enhancement in deep submicron strained Si n-MOSFETs", International Electron Devices Meeting 1998. Technical Digest, (1998), 707-710.

Sato, T, "Trench transformation technology using hydrogen annealing for realizing highly reliable device structure with thin dielectric films", 1998 Symposium on VLSI Technology Digest of Technical Papers, (1998), 206-7.

Sato, T., et al., "SON (Silicon on Nothing) MOSFET using ESS (Empty Space in Silicon) technique for SoC applications", IEDM Technical Digest. International Electron Devices Meeting, (2001), 37.1.1-37.1.4.

Subbanna, Seshadri, "High-Performance Silicon-Germanium Technology", 63rd Device Research Conference Digest, 2005. DRC '05., (2005), 195-196.

Sugiyama, N, et al., "Formation of strained-silicon layer on thin relaxed-SiGe/SiO/sub 2//Si structure using SIMOX technology", Thin Solid Films, 369(1-2), (Jul. 2000), 199-202.

Sung, Chun-Yung, et al., "High Performance CMOS Bulk Technology using Direct Silicon Bond (DSB) Mixed Crystal Orientation Substrates", IEDM Technical Digest, IEEE International Volume, (Dec. 5, 2005), 225-228.

Suni, T, et al., "Effects of Plasma Activation on Hydrophilic Bonding of Si and Si02", Journal of the Electrochemical Society, 149, (2002), G348-51.

Takagi, Shin-Ichi, "Strained-Si- and SiGe-On-Insulator (Strained-SOI and SGOI) MOSFETs for High Performance/Low Power CMOS Application", IEEE Device Research Conference, 2002. 60th DRC. Conference Digest, (2002), 37-40.

Thompson, S. E., "Key Differences for Process-induced Uniaxial vs. Substrate-induced Biaxial Stressed Si and Ge Channel MOSFETs", IEEE International Electron Devices Meeting, 2004. IEDM Technical Digest., (Dec. 2004), 221-224.

Uchida, Ken, "Experimental Study of Biaxial and Uniaxial Strain Effects on Carrier Mobility in Bulk and Ultrathin-body SOI MOSFETs", IEEE International Electron Devices Meeting, 2004. IEDM Technical Digest., (Dec. 2004), 229-232.

Verdonckt-Vandebroek, S., et al., "SiGe-Channel Heterojunction p-MOSFET's", IEEE Transactions on Electron Devices, 41(1), (Jan. 1994), 90-101.

Verdonckt-Vandebroek, S., et al., "SiGe-channel heterojunction p-MOSFETs", IEEE Transactions on Electron Devices, 41(1), (Jan. 1994), 90-101.

Welser, J, "Strain dependence of the performance enhancement in strained-Si n-MOSFETs", IEEE International Electron Devices Meeting 1994. Technical Digest, (Dec. 11-14, 1994), 373-376.

Wijaranakula, W., et al., "Oxygen precipitation in p/p+(100) epitaxial silicon material", Journal of the Electrochemical Society, 134(9), SEH America, Inc., Mater. Characterization Lab., Vancouver, WA, (Sep. 1987), 2310-16.

Wild, M., "Laser Assisted Bonding of Silicon and Glass in Micro-System Technology", http://www.ilt.fhg.de/eng/jb00-s42.html, Fraunhofer ILT—jb00-s42, (2003), 1.

Wolf, et al., "Silicon Processing for the VLSI Era", Lattice Press, vol. 2, (1990), 39-41 pgs.

Wolf, S., et al., "", Silicon Processing for the VLSI Era: vol. 1, Lattice Press: Sunset Beach, CA, (2000), 268-269.

Wolf, S., et al., "Silcon Processing for the VLSI ERA", lattice pRESS,1, (1986), 280-286.

Xiao, Q., et al., "Preparation of thin Strained Si Film by Low Temperature Ge Ion Implantation and High Temperature Annealing", Solid-State and Integrated Circuits Technology, 2004. Proceedings 7th Int'l Conf., 3(3), (Oct. 18, 2004), 2163-2166.

Xuan, Peiqi, et al., "60nm Planarized Ultra-thin Body Solid Phase Epitaxy MOSFETs", IEEE Device Research Conference, Conference Digest. 58th DRC, (Jun. 19-21, 2000), 67-68.

Yin, Haizhou, et al., "Fully-depleted strained-Si on insulator NMOSFETs without relaxed SiGe buffers", IEEE International Electron Devices Meeting, 2003. IEDM '03 Technical Digest., (Dec. 2003), 3.2.1-3.2.4.

Yin, Haizhou, "High Ge-Content Relaxed Si1-xGex Layers by Relaxation on Complaint Substrate with Controlled Oxidation", Electronic Materials Conference, Santa Barbara, Jun. 2002, p. 8.

Zhu, Z H, et al., "Wafer bonding and its application on compliant universal (CU) substrates", Conference Proceedings, 10th Annual Meeting IEEE Lasers and Electro-Optics Society, (Nov. 10-13, 1996), 31.

Zhu, Z H, et al., "Wafer bonding technology and its applications in optoelectronic devices and materials", IEEE Journal of Selected Topics in Quantum Electronics, (Jun. 1997), 927-936.

* cited by examiner

LOCALIZED COMPRESSIVE STRAINED SEMICONDUCTOR

CROSS REFERENCE TO RELATED APPLICATIONS

This present application is continuation of U.S. application Ser. No. 12/463,619, filed May 11, 2009 now U.S. Pat. No. 8,124,977, which is a divisional of application Ser. No. 11/356,335, filed Feb. 16, 2006, now issued as U.S. Pat. No. 7,544,584, all of which are incorporated herein by reference in their entirety.

This application is related to the following commonly assigned U.S. patent applications which are herein incorporated by reference in their entirety: "Micromechanical Strained Semiconductor By Wafer Bonding," U.S. 2004/0224480, filed on May 7, 2003 (089); "Localized Ultra-Thin Strained Silicon On Insulator," U.S. 2004/0217391, filed on Apr. 29, 2003 (093); and "Micro-Mechanically Strained Semiconductor Film," U.S. 2004/0173798, filed on Mar. 5, 2003 (100).

TECHNICAL FIELD

This disclosure relates generally to semiconductor devices, and more particularly, to devices formed with strained semiconductor films.

BACKGROUND

The semiconductor industry continues to strive for improvements in the speed and performance of semiconductor devices. Strained silicon technology has been shown to enhance carrier mobility in both n and p-channel devices, and thus has been of interest to the semiconductor industry as a means to improve device speed and performance. Currently, strained silicon layers are used to increase electron mobility in n-channel CMOS transistors. There has been research and development activity to increase the hole mobility of p-channel CMOS transistors using strained silicon germanium layers on silicon.

It was realized that thin strained layers could be made with larger lattice mismatches and much more strain before yield than was possible with thick bulk samples. This lead to the development of structures with thin silicon germanium layers on silicon to take advantage of the higher hole mobility in germanium. These structures require a silicon capping layer over the silicon germanium layer to prevent incorporation of germanium into the gate oxide insulator, which lead to the development of transistors with enhanced hole mobility using dual channel structures with strained silicon and strained silicon germanium.

FIG. 1A illustrates a known device for improved hole mobility with an n-type silicon substrate 101, a silicon germanium layer 102, a silicon capping layer 103, a gate oxide 104, a gate 105, and N+ source/drain regions 106 and 107. FIG. 1B illustrates a band structure for the device of FIG. 1A, and indicates that some carriers or holes are at the silicon-oxide interface and some are confined in the silicon germanium layer. Both the silicon germanium and the silicon capping layers will be strained if they are thin. Alternatively, the silicon germanium layer may be graded to a relaxed or unstrained layer resulting in more stress in the silicon cap layer. One process for forming silicon over silicon germanium (Si/SiGe) structures uses a relatively expensive ultra high vacuum chemical vapor deposition (UHVCVD) process. The germanium content is graded in steps to form a fully relaxed silicon germanium buffer layer before a thin (e.g. ~20 nm) strained silicon channel layer is grown. A lower cost implantation process has been disclosed in US 2004/0221792 entitled Strained Si/SiGe Structures By Ion Implantation." As disclosed in US 2004/0221792, germanium ions can be implanted into a silicon substrate with a desired dose and energy to at least partially amorphize the surface silicon layer. The substrate is heat treated to regrow a crystalline silicon layer over a resulting silicon germanium layer using a solid phase epitaxial (SPE) process. The crystalline silicon layer is strained by a lattice mismatch between the silicon germanium layer and the crystalline silicon layer.

More recently, strained silicon layers have been fabricated on thicker relaxed silicon germanium layers to improve the mobility of electrons in NMOS transistors. For example, strained silicon layers along the side of relaxed silicon pillars for use in logic circuits have been disclosed (see U.S. Pat. No. 6,900,521 entitled "Vertical Transistors and Output Prediction Logic Circuits Containing Same") and ballistic injection of electrons from high mobility strained silicon layers onto the floating gates of flash memories or into the charge storage regions of NROM Memory devices have been disclosed (see US 2005/0212065 entitled "NROM Memory Device With A High-Permittivity Gate Dielectric Formed By the Low Temperature Oxidation Of Metals," and US 2005/0247972 entitled "Ballistic Direct Injection NROM Cell On Strained Silicon Structures").

Structures with strained silicon on silicon germanium on insulators have been described (see, for example, US 2005/0029619 entitled "Strained Si/SiGe/SOI Islands and Process of Making Same") as well as structures with just strained silicon over a localized oxide insulator region (see US 2004/0217391 entitled "Localized Strained Semiconductor on Insulators"). These structures yield high mobility and high performance transistors on a low capacitance insulating substrate.

Wafer bending has been used to investigate the effect of strain on mobility and distinguish between the effects of biaxial stress and uniaxial stress. Bonding a semiconductor onto bowed or bent substrates has been disclosed to introduce strain in the semiconductor (see US 2005/0020094, entitled "Strained Semiconductor By Full Wafer Bonding"). Stress can also be introduced by wafer bonding (see, for example, US 2004/0224480 entitled "Micromechanical Strained Semiconductor by Wafer Bonding," US 2004/0217352 entitled "Strained Semiconductor By Wafer Bonding With Misorientation," and US 2004/0173798 entitled "Micro-Mechanically Strained Semiconductor Film." Packaging is another technique to introduce mechanical stress by bending.

FIGS. 2-4 illustrate known techniques to strain channels and improve carrier mobilities in CMOS devices. FIG. 2 illustrates a known device design to improve electron mobility in NMOS transistors using a tensile strained silicon layer on silicon germanium. As illustrated, a graded silicon germanium layer 208 is formed on a p-type silicon substrate 209 to provide a relaxed silicon germanium region 210, upon which a strained silicon layer 211 is grown. The transistor channel is formed in the strained silicon layer 211. There is a large mismatch in the cell structure between the silicon and silicon germanium layers, which biaxially strains the silicon layer. The biaxial strain modifies the band structure and enhances carrier transport in the silicon layer. In an electron inversion layer, the subband splitting is larger in strained silicon because of the strain-induced band splitting in addition to that provided by quantum confinement. As illustrated in FIG. 3, uniaxial compressive stress can be introduced in a channel 312 of a PMOS transistor to improve hole mobility using silicon germanium source/drain regions 313 in trenches adjacent to the PMOS transistor. Silicon-carbon source/drain regions in trenches adjacent to an NMOS transistor can introduce tensile stress and improve electron mobility. FIG. 4 illustrates a known device design to improve mobility for both NMOS and PMOS transistors using silicon nitride capping layers 414. These silicon nitride capping layers can be formed to introduce tensile stress for NMOS transistors and can be formed to introduce compressive stress for PMOS transistors.

SUMMARY

The present subject matter relates to strained semiconductor films along with the structures and devices that include strained semiconductor films. The present subject matter further relates to methods of forming the strained semiconductor layers or films along with methods of forming structures and devices that include strained semiconductor layers or films.

The present subject matter provides mechanically-strained semiconductor in local areas of the semiconductor. The strained semiconductor is under compressive strain to provide improved hole mobility. For example, an embodiment bonds a compressively-strained silicon layer to a silicon substrate in local areas. Some embodiments form the compressively-strained silicon layer by bowing an ultrathin silicon film over the surface of a silicon wafer, and bonding the silicon film onto the flat wafer to provide the compressive stress.

One aspect of the present subject matter relates to a method for forming strained semiconductor film. According to an embodiment of the method, a crystalline semiconductor bridge is formed over a substrate. The bridge has a first portion bonded to the substrate, a second portion bonded to the substrate, and a middle portion between the first and second portions separated from the substrate. The middle portion of the bridge is bonded to the substrate to provide a compressed crystalline semiconductor layer on the substrate. According to various embodiments, the substrate is a crystalline silicon substrate, and the compressed crystalline semiconductor layer is a compressed crystalline silicon layer. In various embodiments, the thickness of the crystalline semiconductor layer is within a range of approximately 10 nm to approximately 20 nm; and in various embodiments, the compressed crystalline semiconductor layer has a compression within a range of approximately 0.2% to approximately 1.0%.

According to an embodiment of a method for forming strained silicon, a structure is formed with a planar surface that includes exposed silicon and deposited oxide. The structure includes a crystalline silicon substrate. The structure is oxidized to form an oxide on the crystalline silicon substrate with a first oxide thickness in areas corresponding to the exposed silicon and a second oxide thickness in areas corresponding to the deposited oxide. The oxide is etched to expose silicon in the areas corresponding to the second oxide thickness and to reduce the thickness of the oxide in the areas corresponding to the first oxide thickness to form an oxide island. A native oxide is formed on the exposed silicon. An amorphous silicon layer is formed on the oxide islands. The amorphous silicon layer is in contact with the crystalline silicon substrate on a first side of the oxide island and is in contact with the native oxide on another side of the oxide island. The amorphous silicon layer is heat treated to crystallize the silicon layer using the crystalline silicon substrate to seed crystal formation. The oxide island is removed and the silicon layer is bonded to the crystalline silicon substrate. The silicon layer has a desired compression when bonded to the silicon substrate.

One aspect of the present subject matter relates to a semiconductor structure. An embodiment of a structure comprises a crystalline semiconductor substrate, and a compressed semiconductor layer bonded to the crystalline substrate. In an embodiment, a first portion of the compressed semiconductor layer is in contact with the crystalline substrate, and a second portion of the compressed semiconductor layer is separated from the crystalline substrate by a native oxide. The compressed semiconductor layer has a compressive strain within a range of approximately 0.2% and 1.0%, according to an embodiment. The compressed semiconductor layer has a thickness within a range of approximately 10 nm to approximately 20 nm, according to an embodiment.

These and other aspects, embodiments, advantages, and features will become apparent from the following description of the present subject matter and the referenced drawings.

DETAILED DESCRIPTION

The following detailed description refers to the accompanying drawings which show, by way of illustration, specific aspects and embodiments in which the present subject matter may be practiced. These embodiments are described in sufficient detail to enable those skilled in the art to practice the present subject matter. The various embodiments of the present subject matter are not necessarily mutually exclusive as aspects of one embodiment can be combined with aspects of another embodiment. Other embodiments may be utilized and structural, logical, and electrical changes may be made without departing from the scope of the present subject matter. In the following description, the terms "wafer" and "substrate" are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

FIGS. 5-15 illustrate a process for fabricating a transistor with a channel under compressive strain, according to various embodiments of the present subject matter. The description that follows refers to embodiments with silicon and silicon dioxide or oxide. However, those of ordinary skill in the art will understand how to implement the teachings herein with other semiconductors and insulators.

Figure 1A:
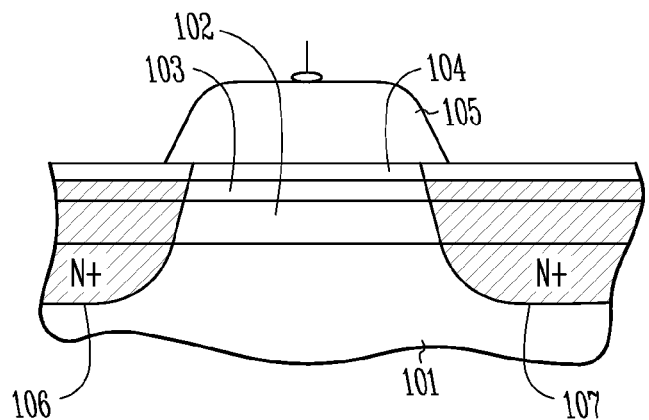
FIG. 1A illustrates a known device for improved hole mobility.
Figure 1B:
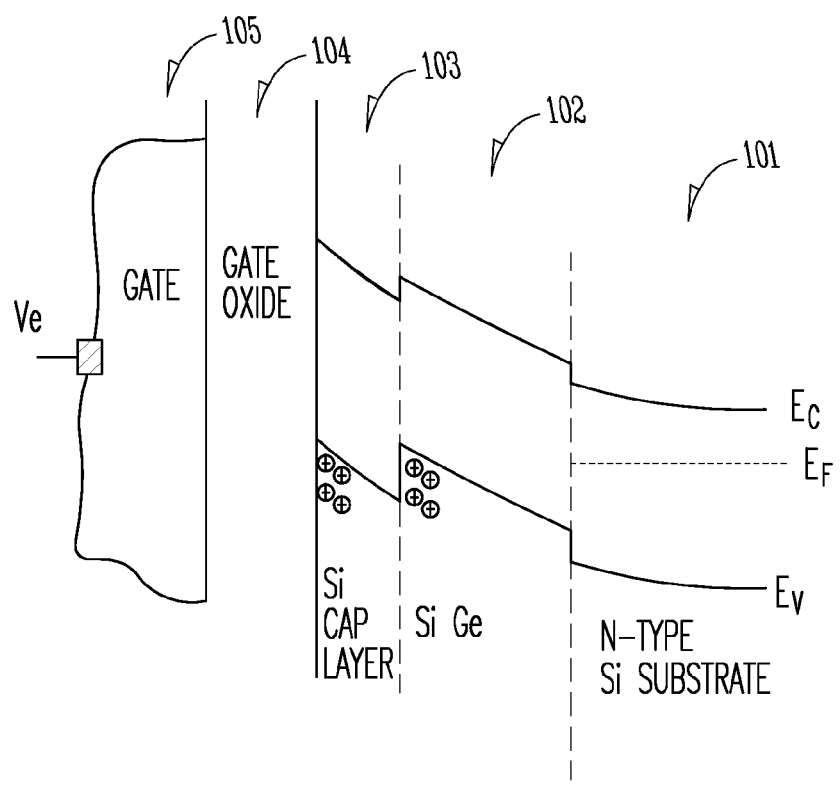
FIG. 1B illustrates a band structure for the device of FIG. 1A.
Figure 2:
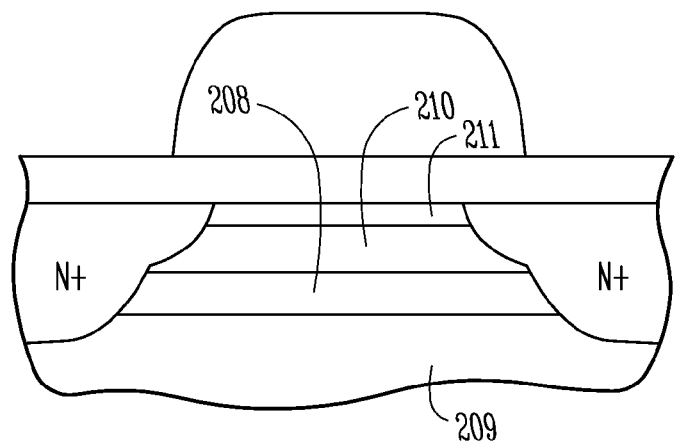
FIG. 2 illustrates a known device design to improve electron mobility in NMOS transistors using a tensile strained silicon layer on silicon germanium.
Figure 3:
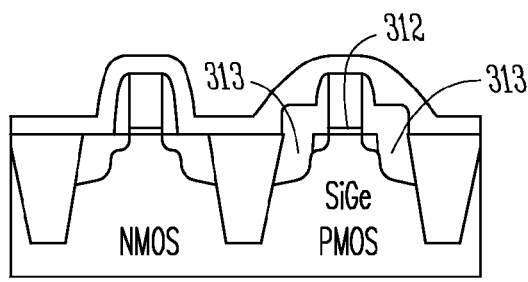
FIG. 3, illustrates a known device design to provide uniaxial compressive stress in a channel of a PMOS transistor using silicon germanium source/drain regions in trenches adjacent to the PMOS transistor.
Figure 4:
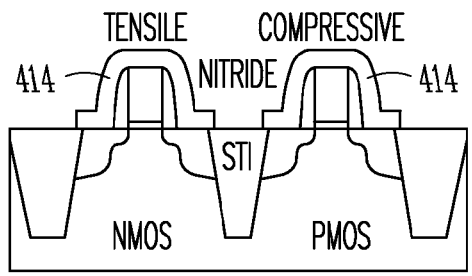
FIG. 4 illustrates a known device design to improve mobility for both NMOS and PMOS transistors using silicon nitride capping layers.
Figure 5:
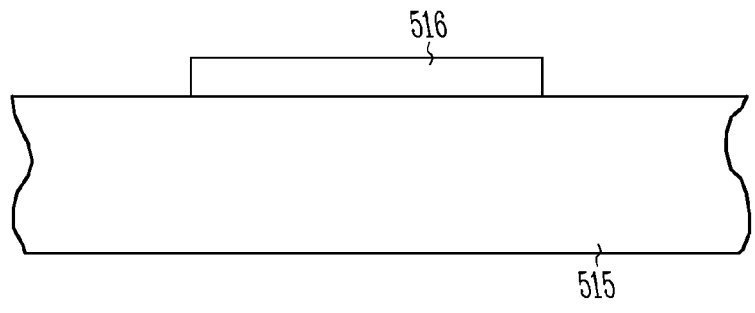
FIGS. 5-15 illustrate a process for fabricating a transistor with a channel under compressive strain, according to various embodiments of the present subject matter.

FIG. 5 illustrates a crystalline silicon substrate 515 with a mask layer 516. The mask layer is patterned to define the areas where there will be localized compressive strain. Thus, the defined areas are used to provide a channel with compressive strain to improve hole mobility for p-channel transistors. In various embodiments, the mask is a silicon nitride. A thin native oxide is between the silicon nitride and the crystalline silicon substrate.

Figure 6:
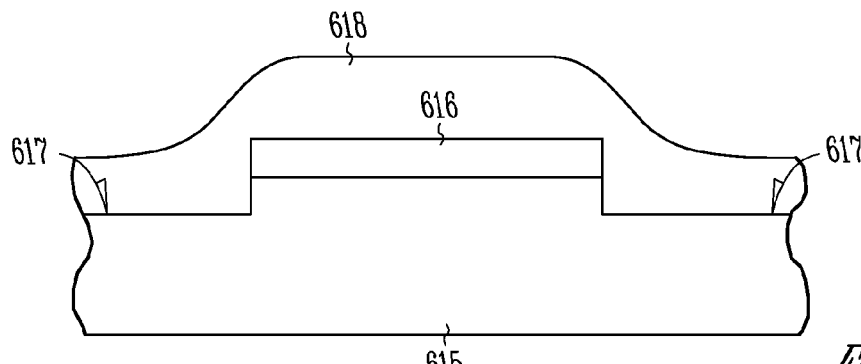

As illustrated in FIG. 6, the exposed crystalline silicon 615 is etched at 617 to a desired depth on each side of the mask 616. A thick oxide layer 618 is deposited. The resulting structure is planarized, such as may be performed by a chemical mechanical planarization (CMP) process. The planarizing process stops on the raised silicon areas 719 to leave islands or strips of silicon 719 and 819 embedded in an oxide 718 and 818, such as is illustrated in the side view of FIG. 7 and the top view of FIG. 8.

Figure 9:
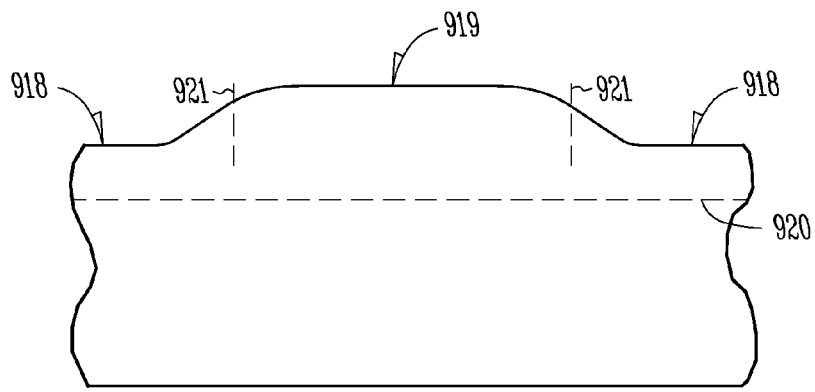

FIG. 9 illustrates the structure after an oxidation process. The dotted line 920 corresponds to the top surface 720 of the structure illustrated in FIG. 7, and the dotted lines 921 correspond to the edges 721 of the oxide islands in FIG. 7. The exposed silicon island 919 oxides rapidly, while the regions covered by the deposited oxide 918 oxidize much more slowly. The thickness of the deposited oxide and the subsequent oxidation is timed to leave the resulting silicon surface planar under the oxides of different thickness, and to provide the desired strain, as will be evident upon reading and comprehending this specification.

Figure 10:
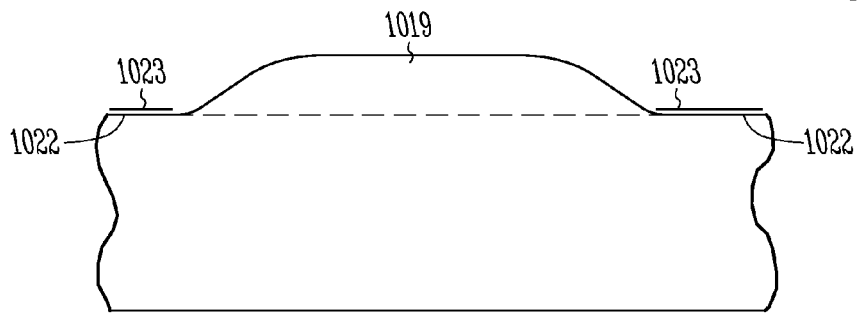

FIG. 10 illustrates the structure after the oxide is etched back to expose the crystalline substrate 1022 and reduce the oxide in the island portion 1019 of the oxide. A "bird's beak" is left at the edges of the oxide islands. The bird's beak has a similar shape to that formed by a LOCal Oxidation of Silicon (LOCOS) process. A native oxide 1023 forms on the exposed silicon areas by exposure to air, water or peroxide.

Figure 11A:
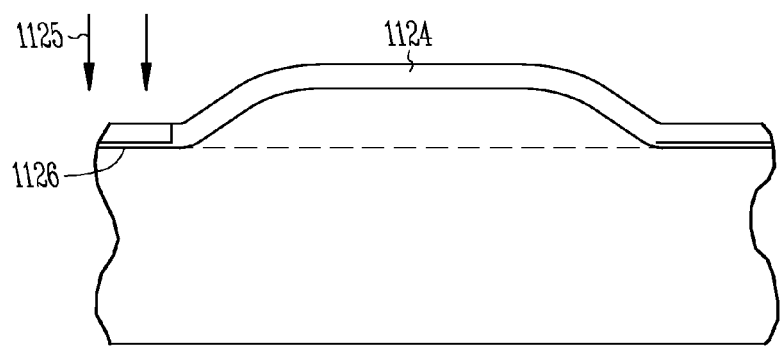
Figure 11B:
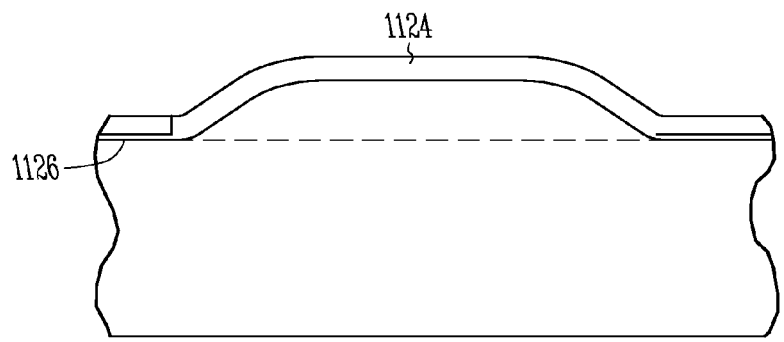

FIGS. 11A and 11B illustrate methods for providing an amorphous silicon layer in contact with the crystalline silicon on one side of the oxide island, according to various embodiments of the present subject matter. As illustrated in FIG. 11A, an amorphous silicon layer 1124 is deposited, and a silicon implant 1125 breaks up the oxide such that the crystalline silicon substrate at 1126 is able to seed the crystalline growth of the amorphous silicon layer. As illustrated in FIG. 11B, the native oxide is removed at 1126 from one side of the oxide island and amorphous silicon 1124 is deposited and patterned over the oxide islands. According to various embodiments, the thickness of the silicon film is within a range from approximately 10 nm to approximately 20 nm. Such thicknesses are capable of being mechanically compressed without affecting yield.

Figure 12:
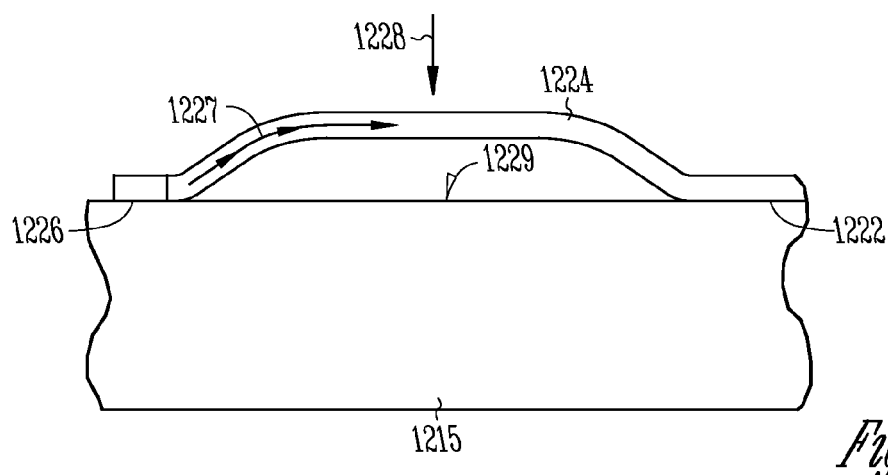

FIG. 12 illustrates a recrystallization process for the amorphous silicon layer, and further illustrates the bonding of the crystallized layer after the oxide island is removed. The recrystallization process is also referred to as a solid phase epitaxial (SPE) process, which includes depositing a thin amorphous silicon layer and annealing the structure to recrystallize the amorphous silicon, where one end of the amorphous layer is seeded to promote a desired crystalline growth. The recrystallization, as illustrated by the arrows 1227, is seeded at 1226 where the silicon layer 1224 is in direct contact with the crystalline silicon substrate 1215, and thus only grows from one side since the other side still has the unperturbed native oxide 1222. According to various embodiments, the silicon film is recrystallized at temperatures from approximately 550° C. to approximately 700° C. The transistor channel is formed in this recrystallized silicon strip. The oxide island is etched from underneath the silicon strip to leave an empty space beneath the silicon strip. As illustrated by the arrow 1228, a silicon strip or silicon bridge layer is influenced toward and bonded to the surface beneath the silicon layer. In various embodiments, the naturally occurring Van der Waal's force is sufficient to influence the bridge layer or film 1224 into contact with the surface 1229 beneath the silicon layer. In various embodiments, a nano-imprint mask is used to assist with influencing the film into contact with the surface beneath the silicon layer.

Figure 13:
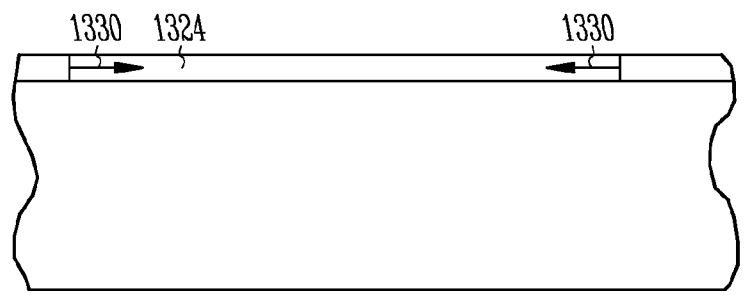

FIG. 13 illustrates the silicon layer bonded to the surface beneath the silicon layer. Since the length of the bowed silicon film strip is longer than the planar surface region of the silicon substrate, the film 1324, now in crystalline form, will be under compressive stress, as illustrated by the arrows 1330, after bonding to the substrate surface.

Figure 14:
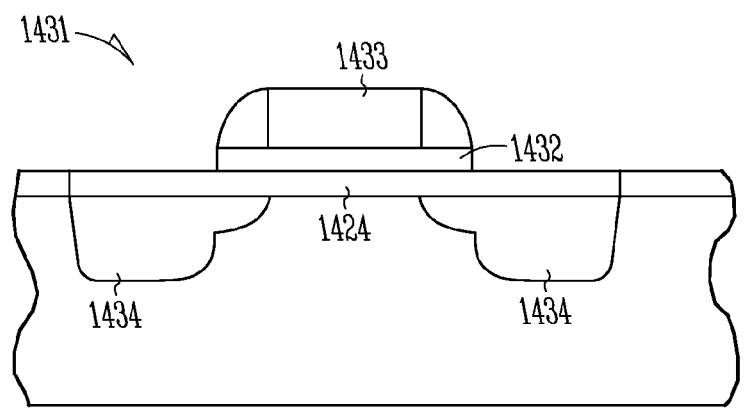

FIG. 14 illustrates a PMOS transistor 1431 fabricated in the structure formed with crystalline silicon under compression. The remaining steps in the PMOS transistor fabrication can be achieved by conventional techniques, in which the compressively-strained ultra-thin silicon strip 1424 forms the transistor channel region. For example, a gate insulator 1432, such as silicon oxide or other gate insulator, is formed on the structure, a gate 1433 is formed on the gate insulator, and source/drain regions 1434 are formed to define a channel 1424 beneath the gate and between the source/drain regions. The source/drain regions can be formed by an ion implantation process.

Figure 15:
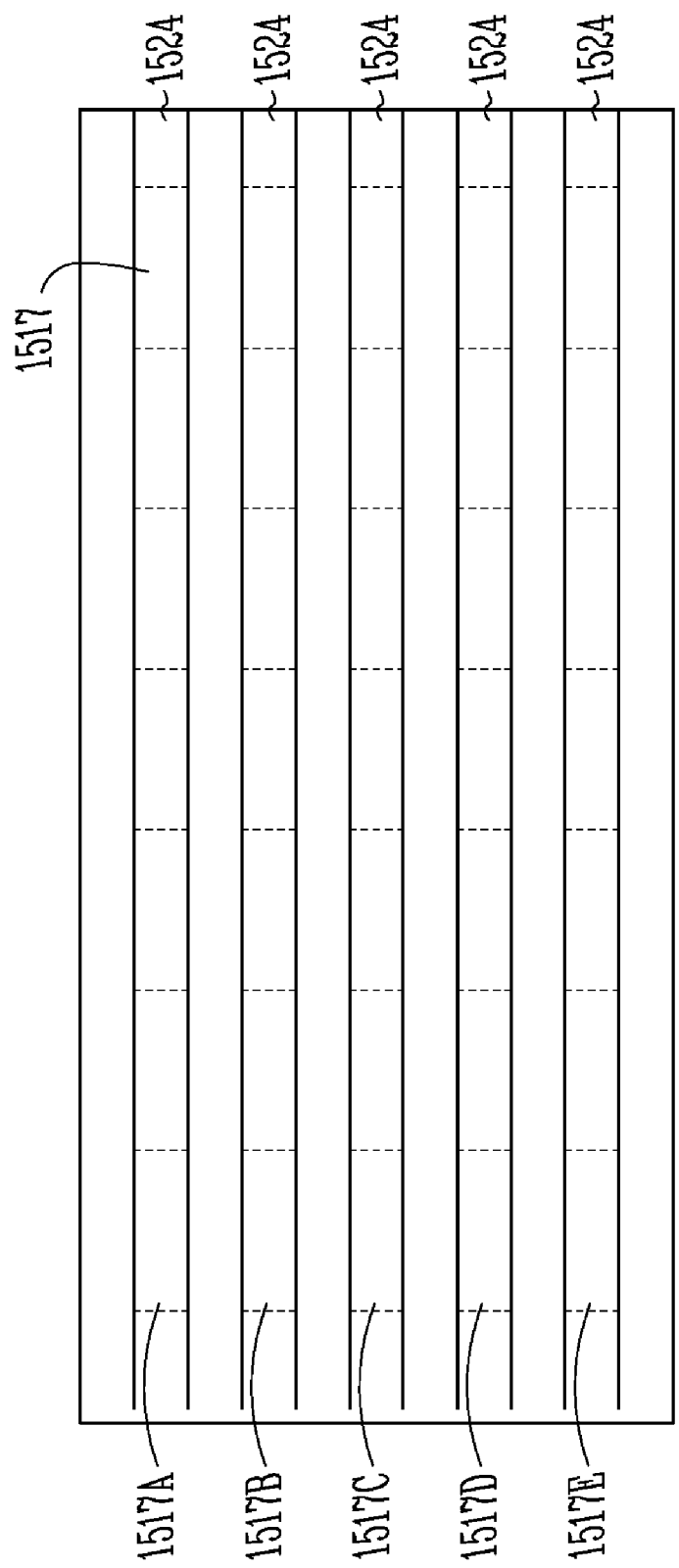

FIG. 15 illustrates a top view of a structure in which a plurality of transistors are being formed, according to various embodiments of the present subject matter. The oxide islands 1517 are illustrated by the dotted line and the amorphous silicon layer 1524 is patterned over the oxide islands to provide a structure such as is illustrated in FIGS. 11A and 11B. The sides of the oxide islands are still exposed, and can be etched to form an empty space between the silicon layer, after crystallization, and the surface beneath the silicon layer. In another embodiment, a number of oxide islands are combined in the column direction to form one oxide area. For example, the column of oxide islands 1517A-1517E can be formed as one oxide area. This oxide area can be etched from underneath the patterned silicon, to allow the silicon to be influenced into contact with the substrate and compressively strained when bonded to the substrate.

Figure 16:
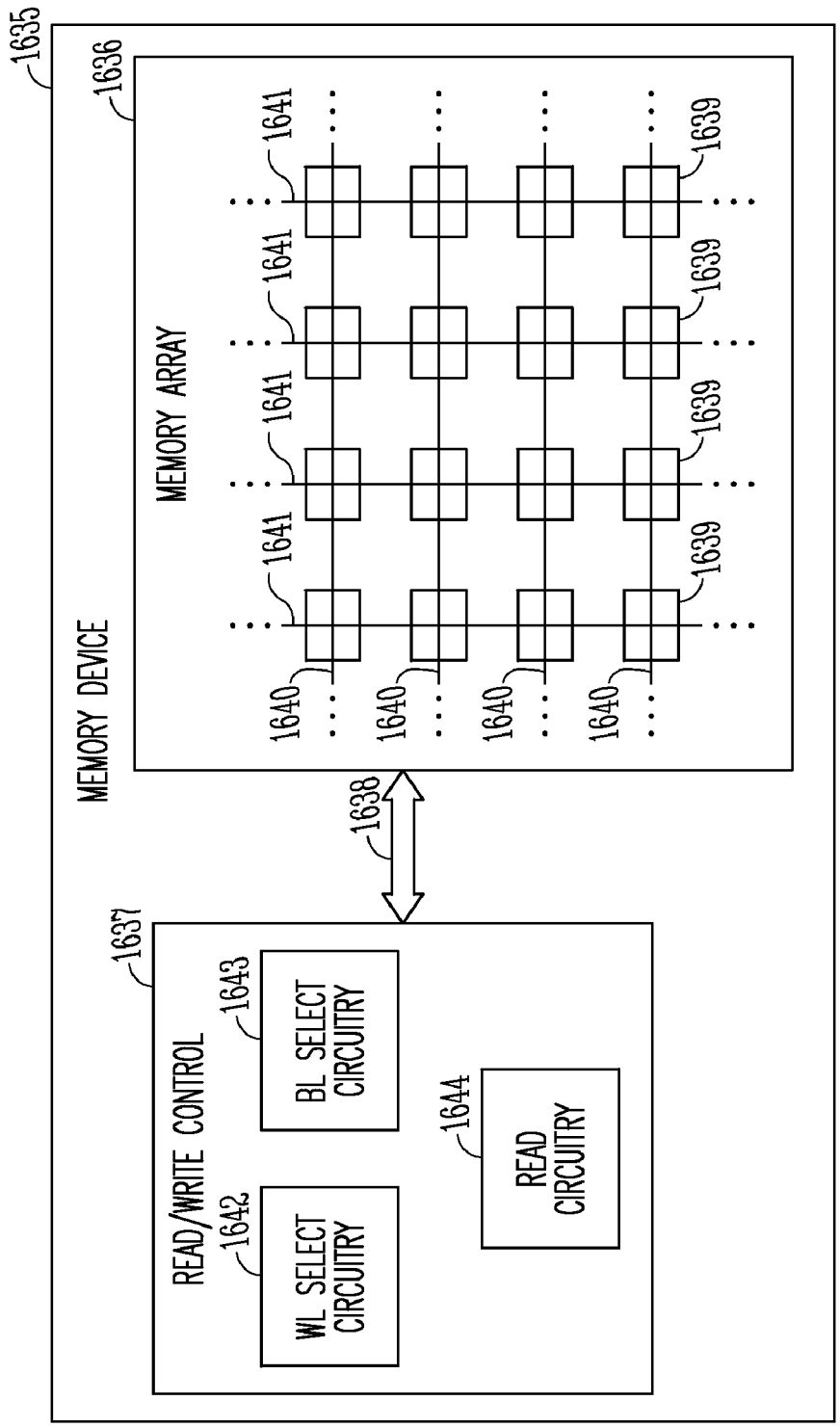
FIG. 16 is a simplified block diagram of a high-level organization of various embodiments of a memory device according to various embodiments of the present subject matter.

FIG. 16 is a simplified block diagram of a high-level organization of various embodiments of a memory device according to various embodiments of the present subject matter. The illustrated memory device 1635 includes a memory array 1636 and read/write control circuitry 1637 to perform operations on the memory array via communication line(s) or channel(s) 1638. The illustrated memory device 1635 may be a memory card or a memory module such as a single inline memory module (SIMM) and dual inline memory module (DIMM). One of ordinary skill in the art will understand, upon reading and comprehending this disclosure, that semiconductor components in the memory array and/or the control circuitry are able to be fabricated using the strained semiconductor films, as described above. For example, in various embodiments, the memory array and/or the control circuitry include transistors with compressively-strained channels for improved hole mobility in p-channel devices. The structure and fabrication methods for these devices have been described above.

The memory array 1636 includes a number of memory cells 1639. The memory cells in the array are arranged in rows and columns. In various embodiments, word lines 1640 connect the memory cells in the rows, and bit lines 1641 connect the memory cells in the columns. The read/write control circuitry 1637 includes word line select circuitry 1642, which functions to select a desired row. The read/write control circuitry 1637 further includes bit line select circuitry 1643, which functions to select a desired column. The read/write control circuitry 1637 further includes read circuitry 1644, which functions to detect a memory state for a selected memory cell in the memory array 1636.

Figure 17:
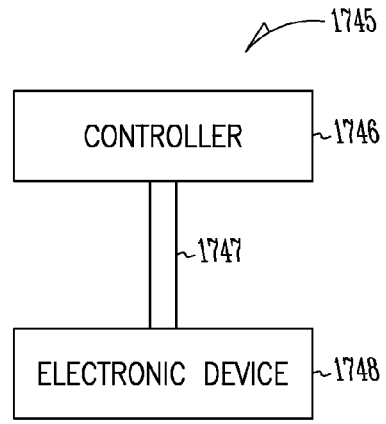
FIG. 17 illustrates a diagram for an electronic system having one or more p-channel transistors with compressively-strained channels for improved hole mobility, according to various embodiments of the present subject matter.

FIG. 17 illustrates a diagram for an electronic system 1745 having one or more p-channel transistors with compressively-strained channels for improved hole mobility, according to various embodiments. Electronic system 1745 includes a controller 1746, a bus 1747, and an electronic device 1748, where the bus 1747 provides communication channels between the controller 1746 and the electronic device 1748. In various embodiments, the controller and/or electronic device include p-channel transistors with compressively-strained channels as previously discussed herein. The illustrated electronic system 1745 may include, but is not limited to, information handling devices, wireless systems, telecommunication systems, fiber optic systems, electro-optic systems, and computers.

Figure 18:
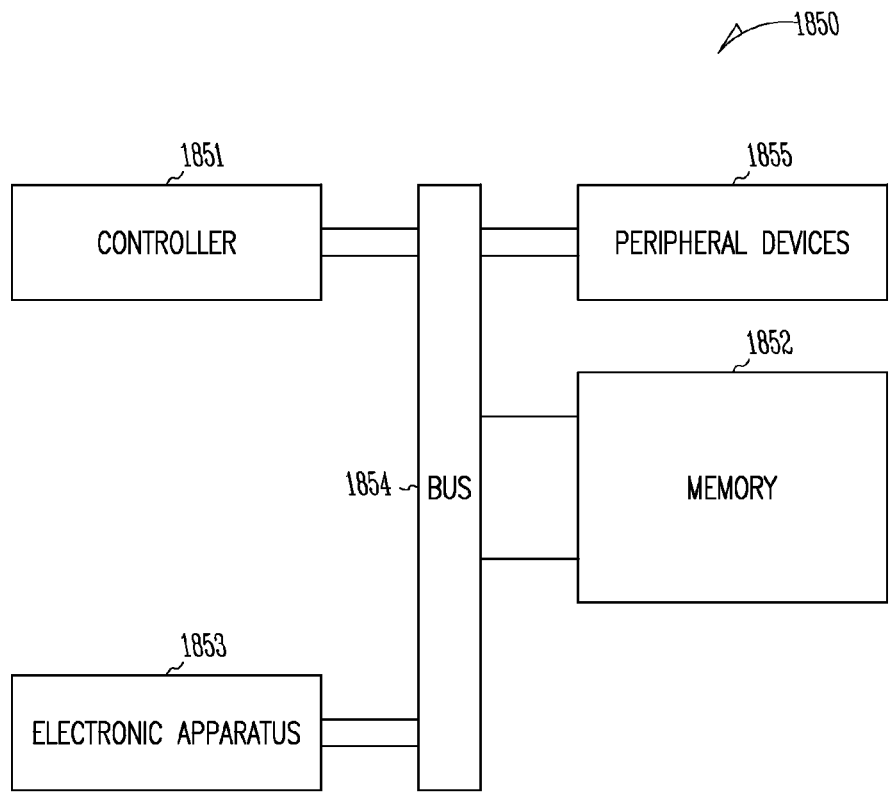
FIG. 18 illustrates an embodiment of a system having a controller and a memory, according to various embodiments of the present subject matter.

FIG. 18 depicts a diagram of an embodiment of a system 1850 having a controller 1851 and a memory 1852. The controller 1851 and/or memory 1852 may include p-channel transistors with compressively-strained channels fabricated according to various embodiments. The illustrated system 1850 also includes an electronic apparatus 1853 and a bus 1854 to provide communication channel(s) between the controller and the electronic apparatus, and between the controller and the memory. The bus may include an address, a data bus, and a control bus, each independently configured; or may use common communication channels to provide address, data, and/or control, the use of which is regulated by the controller. In an embodiment, the electronic apparatus 1853 may be additional memory configured similar to memory 1852. An embodiment may include a peripheral device or devices 1855 coupled to the bus 1854. Peripheral devices may include displays, additional storage memory, or other control devices that operate in conjunction with the controller and/or the memory. In an embodiment, the controller is a processor. Any of the controller 1851, the memory 1852, the electronic apparatus 1853, and the peripheral devices 1854 may include p-channel transistors with compressively-strained channels formed according to various embodiments. The system 1850 may include, but is not limited to, information handling devices, telecommunication systems, and computers. Applications containing strained semiconductor films, such as p-channel transistors with compressively-strained channels, as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The memory may be realized as a memory device containing p-channel transistors with compressively-strained channels formed according to various embodiments. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM). Various emerging memory technologies are capable of using transistors with the compressively-strained channels.

Figure 19:
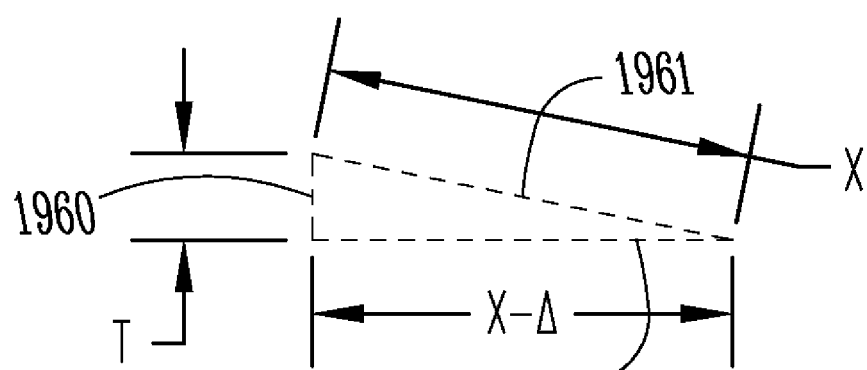
FIG. 19 is a simple triangulation to illustrate the compressive strain that occurs when the recrystallized layer is bonded to the substrate, according to embodiments of the present subject matter.

FIG. 19 is a simple triangulation to illustrate the compressive strain that occurs when the recrystallized layer is bonded to the substrate. The length of the first leg 1960 represents the distance that the oxide extends above the crystalline substrate, the length of the hypotenuse 1961 represents the recrystallized silicon bridge layer before it is compressively bonded to the substrate, and the length of the second leg 1962 represents the recrystallized silicon layer after it is compressively bonded to the substrate. The length of the second leg represents half of the length of the oxide island, as illustrated in FIGS. 11A, 11B and 12. According to various embodiments, the process parameters are controlled to provide a compressive strain within a range of approximately 0.2% and approximately 1.0%.

According to some embodiments, the length of the oxide island is approximately 1000 Å, such that half the oxide island has a length of approximately 500 Å. A reduced length, such as occurs when the silicon bridge layer is compressively bonded to the substrate, of approximately 1 Å ($\Delta \approx 1$ Å) results in a compressive strain of about 0.2%, and a reduced length of approximately 5 Å ($\Delta \approx 5$ Å) results in a compressive strain of about 1.0%. For these dimensions, an oxide height of approximately 32 Å above the exposed silicon substrate corresponds to a compression of approximately 0.2%, and an oxide height of approximately 71 Å above the exposed silicon substrate corresponds to a compression of approximately 1.0%. Those of ordinary skill will understand, upon reading and comprehending this disclosure, how to determine the desired oxide height for a given length of the oxide island to achieve a desired compression when the recrystallized silicon bridge layer is collapsed onto the substrate surface.

Figure 7:
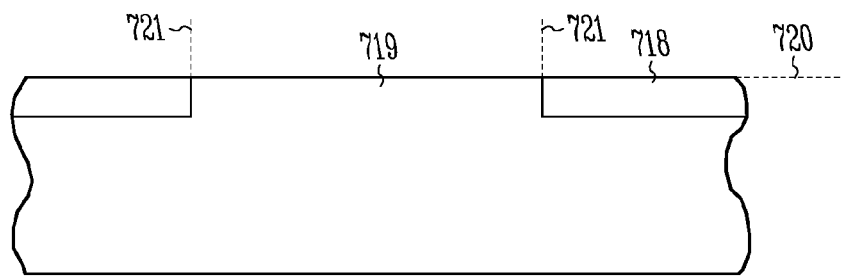
Figure 8:
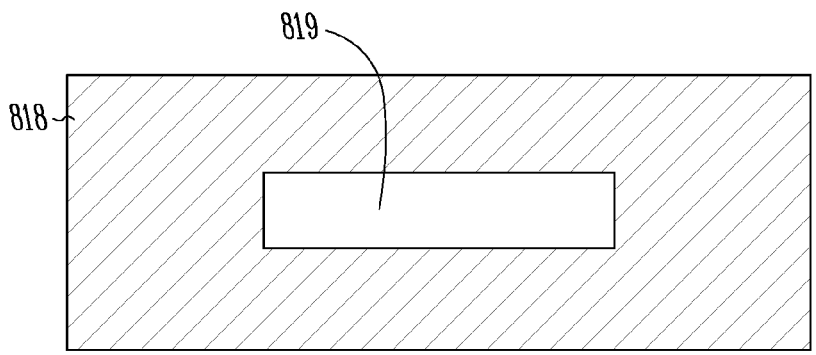
Figure 20:
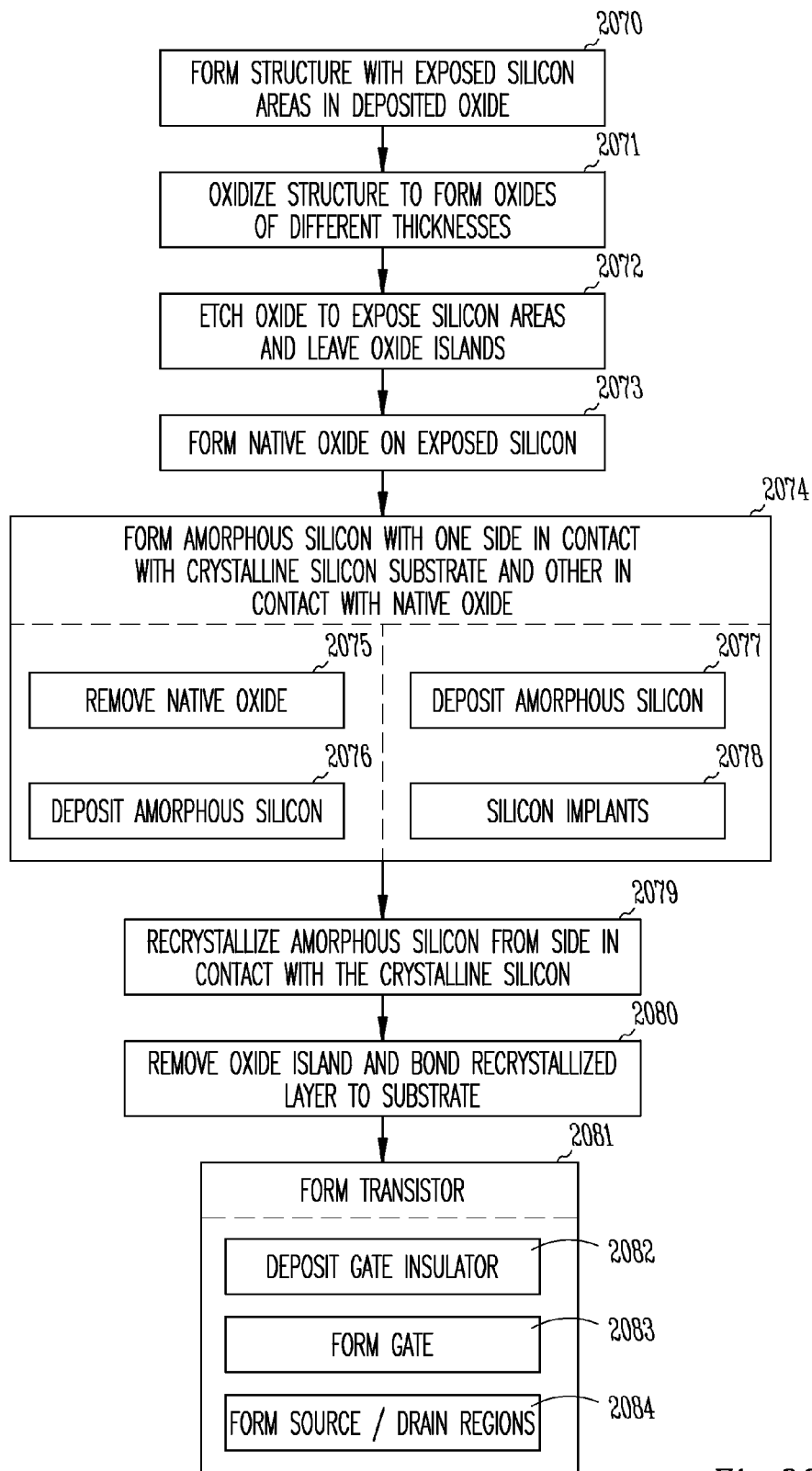
FIG. 20 illustrates a method for forming a transistor with a compressively strained channel, according to various embodiments of the present subject matter.

FIG. 20 illustrates a method for forming a transistor with a compressively strained channel, according to various embodiments of the present subject matter. At 2070, a structure is formed with exposed silicon areas in a deposited oxide, such as is illustrated in FIGS. 7 and 8, for example. At 2071, the structure is oxidized to form oxides of different thicknesses, such as is illustrated in FIG. 9, for example. At 2072 the oxide is etched to expose areas of the crystalline substrate and leave oxide islands, and at 2073 a native oxide is formed on the exposed silicon, such as is illustrated in FIG. 10, for example. At 2074, an amorphous silicon is formed with one side in contact with crystalline silicon substrate and the other side in contact with a native oxide. As illustrated at 2075 and 2076, an embodiment removes the native oxide from one side of the island, and then deposits the amorphous silicon, such as is illustrated in FIG. 11B, for example. As illustrated at 2077 and 2078, an embodiment deposits amorphous silicon, and then performs a silicon implant to break the native oxide, such as is illustrated in FIG. 11A, for example. At 2079, the amorphous silicon is heat treated to recrystallize beginning with the side in contact with the crystalline silicon substrate, such as is illustrated in FIG. 12. Embodiments perform the recrystallization using temperature within a range from approximately 550° C. and approximately 700° C. At 2080, the oxide island is removed from beneath the recrystallized silicon, and the recrystallized silicon is bonded to the substrate, such as is illustrated in the combination of FIGS. 12 and 13, for example. At 2081, a transistor is formed in the structure, using the compressed silicon layer as a channel region. According to an embodiment, forming the transistor includes depositing a gate insulator at 2082, forming a gate at 2083, and forming source/drain regions at 2084.

Very large improvements in PMOS drive current can be realized by compressive strain along the axis of the current flow. Improvements have been demonstrated in PMOS drive current in a 45 nm gate technology where the saturation drain current at 1.2V is up to 800 pA/μm, which is relatively close to the drive current of 1260 pA/μm for NMOS devices with the same technology and voltages. PMOS transistor currents are now not so different than NMOS drive currents, resulting in devices of similar sizes and more symmetrical switching characteristics and times. The reduction in PMOS transistor sizes while achieving drive currents comparable to the NMOS transistors and the resulting more symmetrical switching characteristics will result in roughly a factor of two improvement in CMOS transistor circuit performance.

This disclosure includes several processes, circuit diagrams, and cell structures. The present subject matter is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations of the present subject matter. It is to be understood that the above description is intended to be illustrative, and not restrictive. Combinations of the above embodiments, and other embodiments, will be apparent to those of skill in the art upon reviewing the above description. The scope of the present subject matter should be determined with reference to the appended claims, along with the full scope of equivalents to which such claims are entitled.

What is claimed is:

1. A method for forming a strained semiconductor film at desired locations over a substrate, the method comprising:
    masking the substrate to define and cover the desired locations, wherein exposed portions of the substrate remain after the masking;
    etching the exposed portions of the substrate to create an etched structure;
    depositing an oxide over the etched structure to create an oxide covered structure;
    planarizing the oxide covered structure to create a planarized structure;
    oxidizing the planarized structure to create an oxidized structure;
    etching the oxidized structure to provide an etched oxidized structure with exposed portions of the substrate on opposite sides of each of the desired locations and with oxide remaining over the desired locations;
    depositing amorphous semiconductor over the etched oxidized structure;
    crystallizing the amorphous semiconductor to provide crystallized semiconductor over the etched oxidized structure, wherein the crystallized semiconductor is bonded to the exposed portions of the substrate on opposite sides of each of the desired locations; and
    removing the oxide remaining over the desired locations to allow the crystalline semiconductor to be compressively strained at the desired locations when bonded to the substrate.

2. The method of claim 1, wherein masking includes depositing silicon nitride.

3. The method of claim 1, wherein the substrate is crystalline silicon.

4. The method of claim 1, wherein planarizing includes performing chemical mechanical planarization.

5. The method of claim 1, wherein oxidizing is timed to provide a desired amount of oxide at the desired locations and results in a desired amount of strain in the crystallized structure at the desired locations.

6. The method of claim 1, wherein native oxide forms on the exposed portions of the substrate after etching the oxide structure, the method further comprising implanting ions to break up the native oxide to enable the substrate to seed crystalline growth of the amorphous semiconductor.

7. The method of claim 1, wherein depositing amorphous semiconductor includes depositing amorphous semiconductor with a thickness between about 10 nm to 20 nm.

8. The method of claim 1, wherein crystallizing the amorphous semiconductor includes annealing at about 550 degrees C. to 700 degrees C.

9. The method of claim 1, wherein a naturally-occurring Vander Waal's force influences the crystalline semiconductor into contact with the substrate to compressively strain the crystalline semiconductor.

10. The method of claim 1, further comprising using a nano-imprint mask to influence the crystalline semiconductor into contact with the substrate to compressively strain the crystalline semiconductor.

11. A method of forming p-channel transistors at desired locations over a substrate, the method comprising:
    masking the substrate to define and cover the desired locations for the p-channel transistors, wherein exposed portions of the substrate remain after the masking;
    etching the exposed portions of the substrate to create an etched structure;
    depositing an oxide over the etched structure to create an oxide covered structure;
    planarizing the oxide covered structure to create a planarized structure;
    oxidizing the planarized structure to create an oxidized structure;
    etching the oxidized structure to provide an etched oxidized structure with exposed portions of the substrate on opposite sides of each of the desired locations and with oxide remaining over the desired locations;
    depositing amorphous semiconductor over the etched oxidized structure;

crystallizing the amorphous semiconductor to provide crystallized semiconductor over the etched oxidized structure, wherein the crystallized semiconductor is bonded to the exposed portions of the substrate on opposite sides of each of the desired locations;

removing the oxide remaining over the desired locations to allow the crystalline semiconductor to be compressively strained at the desired locations when bonded to the substrate;

forming gate insulators over the compressively strained crystalline semiconductor, wherein forming gate insulators includes forming a gate insulator at each of the desired locations;

forming a gate on each of the gate insulators; and forming first and second diffusion regions to define a channel in the compressively strained crystalline semiconductor below each gate insulator.

12. The method of claim 11, wherein depositing amorphous semiconductor over the etched oxidized structure includes depositing amorphous silicon.

13. The method of claim 11, wherein oxidizing is timed to provide a desired amount of oxide at the desired locations and results in a desired amount of strain in the crystallized structure at the desired locations.

14. The method of claim 13, wherein the desired amount of strain is compressive strain between 0.2% and 1.0%.

15. The method of claim 13, wherein native oxide forms on the exposed portions of the substrate after etching the oxide structure, the method further comprising implanting ions to break up the native oxide to enable the substrate to seed crystalline growth of the amorphous silicon layer.

16. The method of claim 13, wherein a naturally-occurring Vander Waal's force influences the crystalline semiconductor into contact with the substrate to compressively strain the crystalline semiconductor.

17. The method of claim 13, further comprising using a nano-imprint mask to influence the crystalline semiconductor into contact with the substrate to compressively strain the crystalline semiconductor.

18. A method of forming a memory device, comprising:
forming a memory array and control circuitry operably connected to the memory array to control read and write functions for the memory array, wherein forming the memory array and control circuitry includes forming p-channel transistors at desired locations over a substrate, wherein forming p-channel transistors includes:
masking the substrate to define and cover the desired locations for the p-channel transistors, wherein exposed portions of the substrate remain after the masking;
etching the exposed portions of the substrate to create an etched structure;
depositing an oxide over the etched structure to create an oxide covered structure;
planarizing the oxide covered structure to create a planarized structure;
oxidizing the planarized structure to create an oxidized structure;
etching the oxidized structure to provide an etched oxided structure with exposed portions of the substrate on opposite sides of each of the desired locations and with oxide remaining over the desired locations;
depositing amorphous semiconductor over the etched oxidized structure;
crystallizing the amorphous semiconductor to provide crystallized semiconductor over the etched oxidized structure, wherein the crystallized semiconductor is bonded to the exposed portions of the substrate on opposite sides of each of the desired locations;
removing the oxide remaining over the desired locations to allow the crystalline semiconductor to be compressively strained at the desired locations when bonded to the substrate;
forming gate insulators over the compressively strained crystalline semiconductor, wherein forming gate insulators includes forming a gate insulator at each of the desired locations;
forming a gate on each of the gate insulators; and
forming first and second diffusion regions to define a channel in the compressively strained crystalline semiconductor below each gate insulator.

19. The method of claim 18, wherein oxidizing is timed to provide a desired amount of oxide at the desired locations and results in a desired amount of strain in the crystallized structure at the desired locations, wherein the desired amount of strain is compressive strain between 0.2% and 1.0%.

20. The method of claim 18, wherein depositing amorphous semiconductor includes depositing amorphous semiconductor with a thickness between about 10 nm to 20 nm.

* * * * *